United States Patent [19]

Kowalczyk et al.

[11] Patent Number: 5,094,164
[45] Date of Patent: Mar. 10, 1992

[54] METHOD AND DEVICE FOR IN-REGISTER EXPOSING AND IN-REGISTER PRINTING OF A FLEXIBLE LETTERPRESS FORM

[75] Inventors: Karl Kowalczyk; Franz Arendt, both of Walldorf, Fed. Rep. of Germany

[73] Assignee: Heidelberger Druckmaschinen Ag, Heidelberg, Fed. Rep. of Germany

[21] Appl. No.: 537,375

[22] Filed: Jun. 13, 1990

[30] Foreign Application Priority Data

Jun. 13, 1989 [DE] Fed. Rep. of Germany ....... 3919281

[51] Int. Cl.$^5$ .......................... B41F 5/24; G03B 27/22
[52] U.S. Cl. ................................ 101/401.1; 101/401.3; 101/486; 101/DIG. 36; 33/618; 355/85; 355/104
[58] Field of Search ..................... 355/85, 91, 104, 105, 355/117; 101/481, 486, 485, 493, DIG. 36, 395, 401.3, 401.1; 33/618, 621, 615

[56] References Cited

U.S. PATENT DOCUMENTS

| 1,043,430 | 11/1912 | Huebner | 355/104 X |
| 2,417,496 | 3/1947 | Huebner | 101/DIG. 36 |
| 2,560,696 | 7/1951 | Huebner | 355/85 |
| 3,347,161 | 10/1967 | Lenk et al. | 101/401.3 X |
| 3,369,471 | 2/1968 | Fries et al. | 355/85 |
| 4,380,956 | 4/1983 | Elworthy | 101/401.1 |
| 4,833,985 | 5/1989 | Kojima et al. | 101/DIG. 36 |

FOREIGN PATENT DOCUMENTS

| 2010900 | 9/1971 | Fed. Rep. of Germany . |
| 3545172 | 7/1987 | Fed. Rep. of Germany . |
| 0124250 | 7/1985 | Japan | 101/DIG. 36 |

Primary Examiner—Clifford D. Crowder
Attorney, Agent, or Firm—Herbert L. Lerner; Laurence A. Greenberg

[57] ABSTRACT

A method of in-register exposing and printing of a flexible letterpress form for spot varnishing, which comprises fixing on a copying cylinder in-register a flexible letterpress form having a register system in a region of the leading edge of the form, and exposing the form, then clamping the flexible letterpress form on a rubber-blanket cylinder having a greater diameter than that of the copying cylinder so as to compensate for distortion of a subject in circumferential direction during circular exposure.

9 Claims, 5 Drawing Sheets

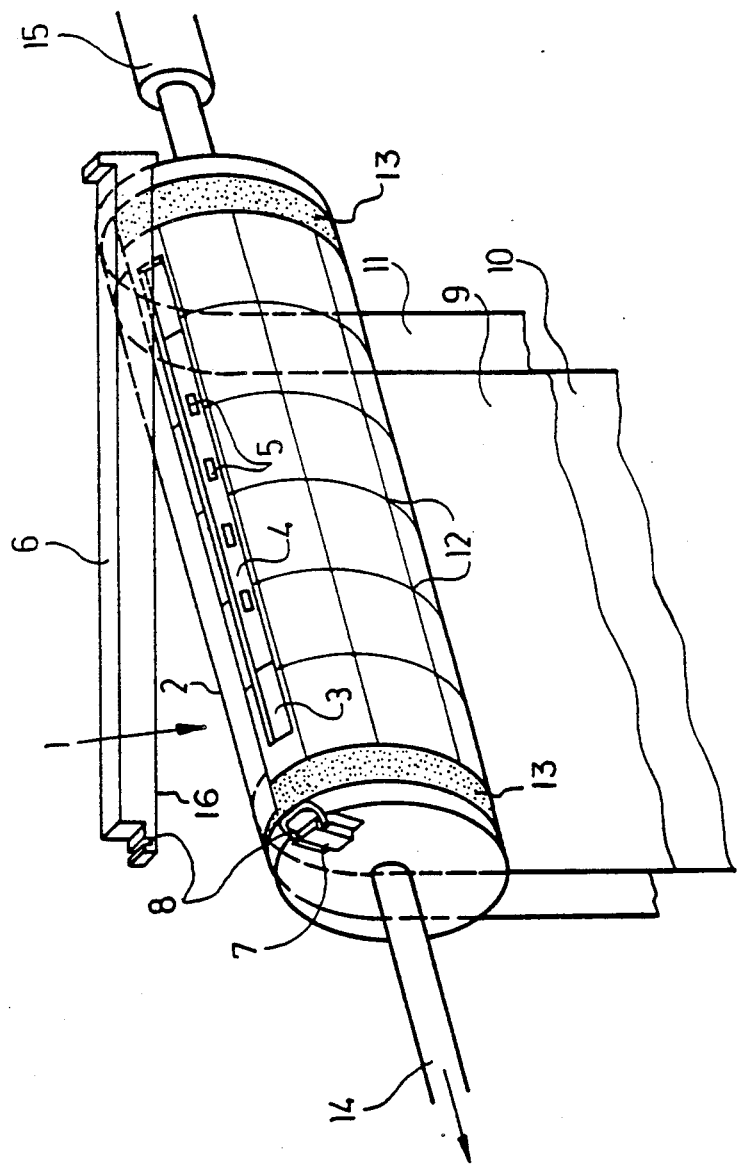

METHOD AND DEVICE FOR IN-REGISTER EXPOSING AND IN-REGISTER PRINTING OF A FLEXIBLE LETTERPRESS FORM

The invention relates to a method and device for in-register exposing and printing of a flexible letterpress form, more particularly, for spot varnishing and other printing operations (color imprints, text imprints, metallic colors).

In modern offset printing presses, an additional device provides the possibility of applying varnish in-line onto the printed products in a varnishing unit following the printing units. The varnish is transferred thereat directly, and not indirectly as in offset printing, from the rubber blanket or from a flexographic form mounted on the rubber-blanket cylinder onto the printed product.

Varnish coatings offer the advantage that the surface of the printed products is better protected against wear during further processing and, above all, also during the use of the printed products. Furthermore, a varnish coating endows the printed product with a more advantageous appearance and thus contributes towards its refinement or improvement.

In the production of high-quality printed products, a further possible application of varnish is increasingly moving into the foreground: varnish as a selectively introduced design medium. Thus, for example, in the area of advertising, so-called spot or recess varnishing is being used increasingly with high-quality branded products, for the artistic design of the packaging material thereof. To enable such spot varnishing to be employed effectively as a design medium, it is necessary to apply the varnish precisely at the desired locations.

The in-register application of the varnish is not without its problems, because the varnish-bearing areas of a flexographic plate for spot varnishing are distorted in the circumferential direction during exposure on a copying cylinder and during subsequent clamping on the rubber-blanket cylinder of an offset printing press. This distortion effect results from the fact that two different embodiments of printing forms are used in in-line spot varnishing:

a) the offset printing form wherein the printing and non-printing areas lie in one plane, and
 b) the flexible letterpress form wherein the varnish-transferring areas are raised above the recesses.

Both plates are exposed by the contact method with a film mask corresponding to the desired printing format. Whereas the offset printing plate is exposed and is also printed true-to-scale over the entire format, the raised parts of the flexible letterpress plate are distorted in the circumferential direction by the exposure onto the copying cylinder and by the clamping onto the rubber-blanket cylinder. This distortion is dependent upon the diameter of the plate cylinder and is all the greater, the higher the raised areas are above the base surface.

A further problem in the exposing and subsequent printing of a flexographic printing plate relates to the adherence to the leading edge of the printing plate. For this purpose, it is necessary that the printing plate should have a register device which permits its precise, in-register positioning on the copying cylinder and on the rubber-blanket cylinder, respectively.

Register devices themselves have become known heretofore. German Published Non-Prosecuted application (DE-OS) 20 10 900 presents a register device for vertical and horizontal copying machines for exposing offset printing plates. The printing plate is provided with stamped-out slits at the front or leading and rear or trailing edges thereof. Disposed on the foundation or base of the copying machine are register pins, which engage in the slits formed in the printing plate.

German Published Non-Prosecuted application (DE-OS) 35 45 172 describes a device for in-register aligning a rubber blanket for recessed in-line varnishing. With this device, it is possible to make corrections to the rubber blanket both in the circumferential direction as well as in axial direction. With this device, distortion effects which occur during exposure on the copying cylinder and during subsequent clamping on the rubber-blanket cylinder are prevented in a very time-intensive and labor-intensive manner: a cast of the ink form, which provides guide lines for the recessed in-line varnishing, is transferred to the dry rubber blanket by printing. In order to cut out the areas which are not to be varnished, the rubber blanket is taken out of the printing press, is processed and then re-inserted into the printing press. An undoubted further disadvantage of this method of producing a spot varnishing plate is that mechanical processing of the printing form cannot be performed with such accuracy and detail as is possible by exposing a photopolymerizable printing form.

It is accordingly an object of the invention, therefore, to provide a method and device which, while utilizing register devices, permit an accurately in-register transfer of varnish onto a printed product from a flexible letterpress form for spot varnishing.

With the foregoing and other objects in view, there is provided, in accordance with one aspect of the invention, a method of in-register exposing and printing of a flexible letterpress form for spot varnishing, which comprises fixing on a copying cylinder in-register a flexible letterpress form having a register system in a region of the leading edge of the form, and exposing the form, then clamping the flexible letterpress form on a rubber-blanket cylinder having a greater diameter than that of the copying cylinder so as to compensate for distortion of a subject in circumferential direction during circular exposure.

In accordance with another aspect of the invention, there is provided a device for in-register exposing and printing of a flexible letterpress form for spot varnishing comprising, a copying cylinder formed with an axially parallel recess, a register bar with register elevations disposed in the recess in precise register with a register system of a flexible letterpress form, a clamping bar for fixing the flexible letterpress form on the copying cylinder, a rubber-blanket clamping rail likewise having register elevations disposed thereon, the register elevations of the clamping rail engaging in the register system of the flexible letterpress form, the copying cylinder and the rubber-blanket cylinder having different diameters for printing the letterpress form without distortion onto a printed product produced by offset printing.

In accordance with another mode of the invention, the method includes forming the flexible letterpress form with a dimensionally stable substrate. In conjunction with the register system, assurance is provided that the leading edge of the printing plate does not shift due to yielding or expansion of the plate. Furthermore, the stability of the material prevents the flexographic printing plate from expanding during the development of the impression or the performance of the printing operation. The foregoing requirement with respect to the material of the substrate is important because, without it, the in-register positioning of the flexible letterpress form is considerably more time and labor-consuming.

In accordance with a further mode of the invention, the method includes maintaining registry with the register system from mounting of the film to clamping in the varnishing unit, the register system being formed of register holes and register cut-outs. Film mountings for flexographic and offset plates can thus be made identical in size. This ensures that the leading edge of the plate can be maintained precisely. The relatively simple, in-register insertion of the register holes and register cut-outs into the register bar of the copying cylinder and then around the register elevations of the rubber-blanket clamping rail permits extremely short set-up times.

In accordance with another feature of the device of the invention, the side walls of the axially parallel recess are flattened. This ensures that the flexible letterpress plate rests firmly throughout on the copying cylinder. A shifting of the leading edge of the plate due to varying stresses or deformations at the edges of the recess is thereby prevented.

The clamping device for clamping the flexographic printing plate on the copying cylinder is relatively simple yet effective in construction. In accordance with a further feature of the device according to the invention, the clamping bar, which has a hinge-type joint at one end face thereof, is swingable into the recess. The overlapping ends of the flexographic printing plate are clamped between the rubber-coated underside of the clamping rail and the register elevations of the register bar. The clamping rail is fixed in-register in the recess by means of a snap or catch lock, which is attached to the opposite end face of the copying cylinder.

The overlap of the end regions of the flexographic printing plate on the copying cylinder is such that the flexographic printing plate has sufficient space in spite of the smaller copying-cylinder diameter. Maintenance of the leading edge is ensured by the register system of the flexographic printing plate and by the register elevations of the register bar.

In accordance with an added feature of the invention, the device includes an underlay for the flexible letterpress form, the underlay being disposed on the rubber-blanket cylinder for varying the diameter thereof. A slight re-adjustment of the diameter of the rubber-blanket cylinder can thus be effected in a relatively simple manner.

In accordance with a concomitant feature of the invention, the clamping bar is comprised of a clamping device, and counterweights for the clamping device are disposed in the interior of the copying cylinder. This measure serves for the rotational course of the copying cylinder during the exposure. An advantageous development therefrom is that the vacuum pump volume decreases by the volume of the counterweights.

Other features which are considered as characteristic for the invention are set forth in the appended claims.

Although the invention is illustrated and described herein as embodied in a method and device for in-register exposing and in-register printing of a flexible letterpress form, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

FIG. 1 is a perspective view of a vacuum-type copying cylinder;

Figure 4:
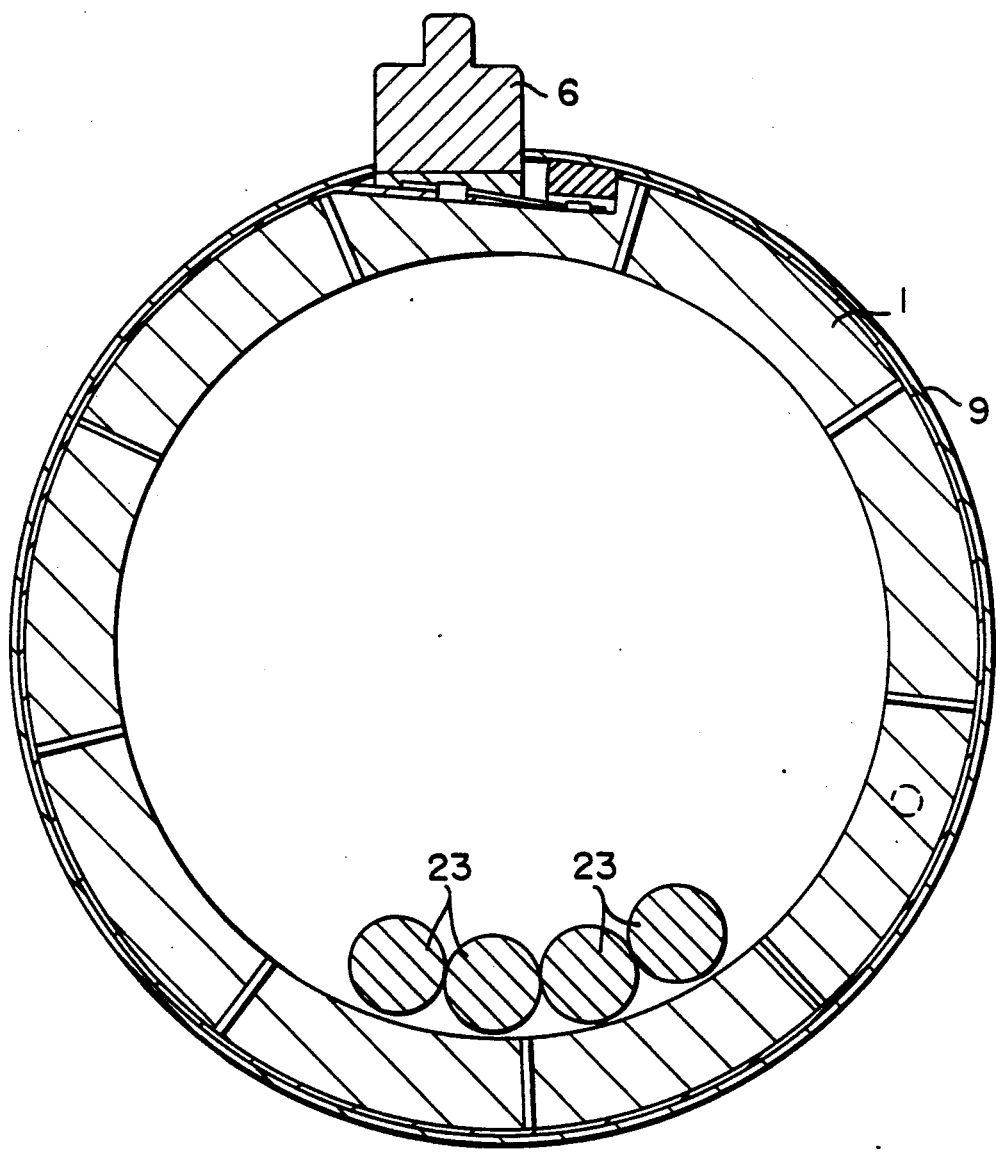
FIG. 4 is a diagrammatic cross-sectional view of another embodiment of the invention.

Referring now to the drawing and, first, particularly to FIG. 1 thereof, there is shown therein a perspective view of the vacuum-type copying cylinder 1. A flexible letterpress form 9 and a film mask 10 are hooked onto register elevations 5 of a register bar 4 by means of a register system. The register bar 4 is seated in an axially-parallel recess 3. For an exposure process, the flexible letterpress form 9, the film mask 10 and a cover foil 11 are laid once around a cylinder jacket 2 of the vacuum-type copying cylinder 1, with the leading and trailing regions of the flexible letterpress form 9 and the cover foil 11 each overlapping in the vicinity of the recess 3. A clamping bar 6 is swung into the recess 3; an overlap is fixed in place by means of the clamping bar 6 being secured in a relatively simple manner by means of a snap lock 7 attached to an end face of the vacuum-type copying cylinder 1, an eye 8 on the clamping bar 6 being hooked into the snap lock 7. The clamping bar 6 thus forms part of a clamping device 6, 7, 8. As shown in FIG. 4, counterweights 23 for the clamping device 6, 7, 8 are disposed in the interior of the coping cylinder 1.

Prior to the performance of the actual exposure process, care must be taken that the flexible letterpress form 9 and the film mask 10 are lying flat on the vacuum-type copying cylinder 1. This is achieved by evacuating the volume of air present between the cylinder jacket 2 and the cover foil 11. Evacuation of the air is effected via vacuum channels with bores 12 which run through the cylinder jacket 2. By means of an intake nozzle 14, the vacuum channels with the bores 12 are connected to a non-illustrated vacuum pump. The cover foil 11 rests, at the edges thereof, on a sponge-rubber seal 13, that when the vacuum is applied, an effective, air-tight seal is obtained also at the sides.

The exposure device itself is not shown in FIG. 1. It is formed conventionally of two cylindrical half-shells, which surround the vacuum-type copying cylinder 1, and on the inner surfaces of the half-shells with fluorescent tubes are provided which are suitable for the exposing of photopolymers. The vacuum-type copying cylinder 1 is mounted so as to be rotatable in the exposure device, and is rotatably driven during the exposure process by means of a motor 15. Uniform exposure is thereby assured.

Figure 2A:
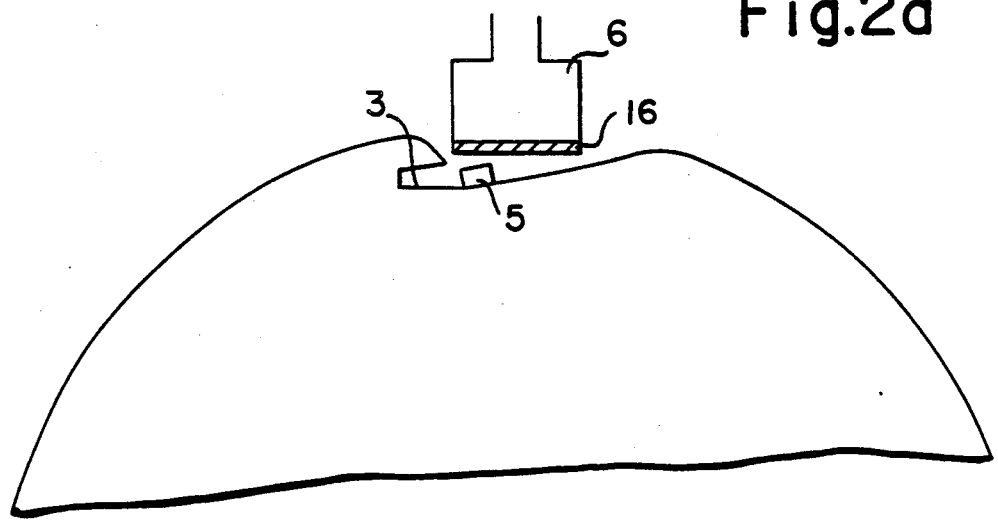
FIG. 2a is an enlarged fragmentary diagrammatic cross-sectional view of the vacuum-type copying cylinder without any flexible letterpress form disposed thereon.
Figure 2B:
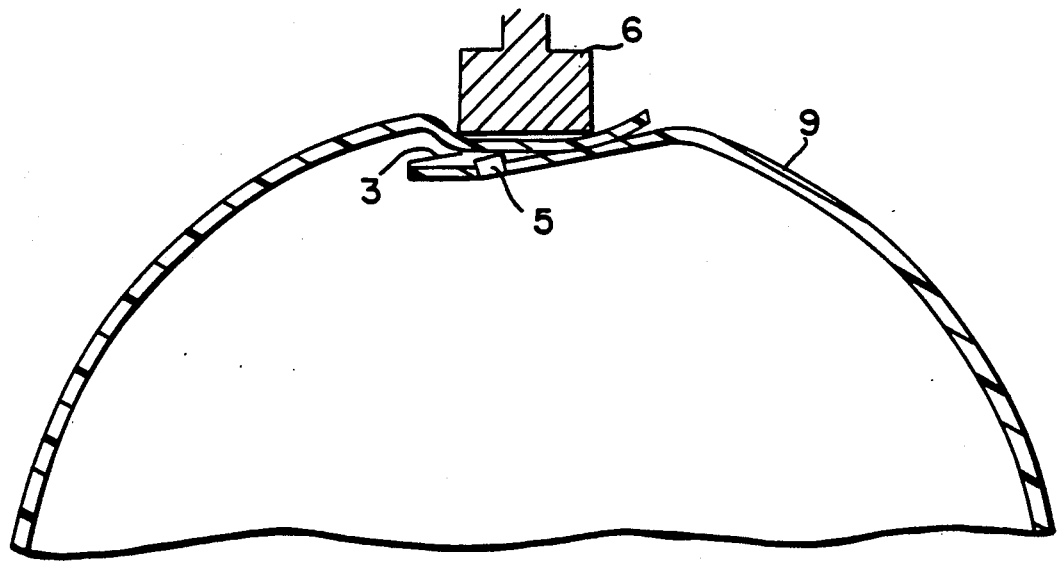
FIG. 2b is a view like that of FIG. 2a of the copying cylinder with a flexible letterpress form disposed thereon.

FIGS. 2a and 2b, respectively, show a cross section of the vacuum-type copying cylinder 1, FIG. 2b differing from FIG. 2a only in that, in this case, the vacuum-type copying cylinder 1 is provided with the flexible letterpress form 9 clamped in position.

The advantageous construction of the axially-parallel recess 3 is readily apparent from FIGS. 2a and 2b, in that, to ensure contact between the flexible letterpress form 9 and the cylinder jacket without deformation at any point, a transition from the recess 3 to the outer cylindrical shape of the cylinder jacket is flattened. The register elevations 5 of the register bar 4 are disposed in the recess 3. Above the recess 3, is the inwardly swingable clamping bar 6, which is coated on the underside thereof with a rubber layer 16. This rubber layer 16 contributes towards a more stable fixation of the flexible letterpress form 9, the film mask 10 and the cover foil 11, because the clamping bar 6, due to the flexibility of the rubber layer 16, rests better on the base. This also improves the clamping action between the plate or form 9, the film 10 and the cover foil 11, and prevents, particularly, the uppermost layer, i.e. the cover foil 11, from sliding out during the exposure process.

FIG. 2b shows the same cross section as in FIG. 2a; in this case, however, there is shown how the flexible letterpress form 9 is fixed on the copying cylinder 1. The flexible letterpress form 9 is formed with register holes 17 by means of which it is hooked into the register elevations 5 of the register bar 4. An overlap or overlapping portion of the respective flexible letterpress form 9, the film mask 10 and the cover foil 11 (not shown separately in the drawing) is fixed between the recess 3 and the clamping bar 6.

Figure 2C:
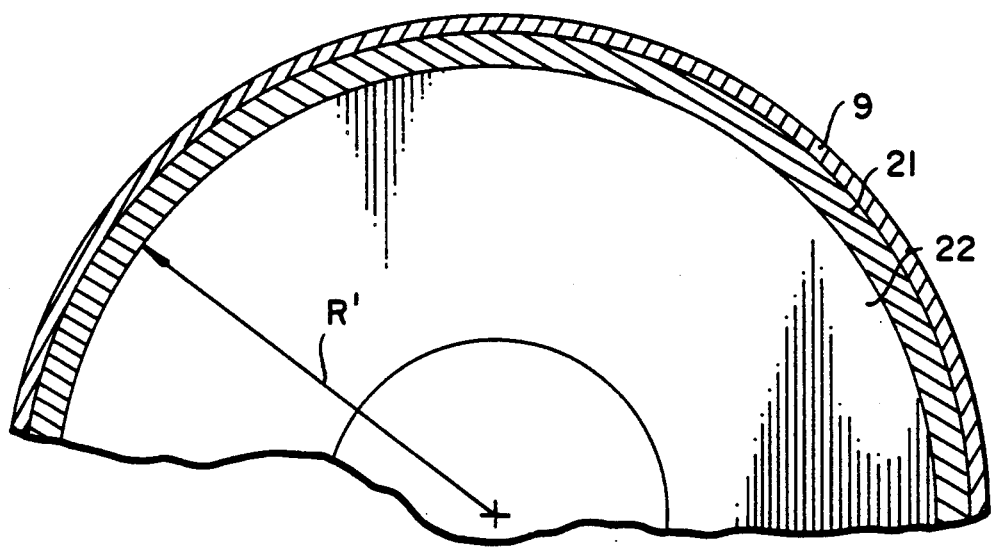
FIG. 2c is an enlarged fragmentary diagrammatic cross-sectional view of a rubber-blanket cylinder with a flexible letterpress form disposed thereon.

FIG. 2c diagrammatically shows a rubber-blanket cylinder 22 carrying the flexible letterpress form 9. The rubber-blanket cylinder 22 has a diameter R' which is grater than the diameter R of the copying cylinder 1 so as to compensate for distortion of a subject in circumferential direction during circular exposure. An underlay 21 is provided for the form 9 on the cylinder 22 for varying the diameter of the latter.

Figure 3:
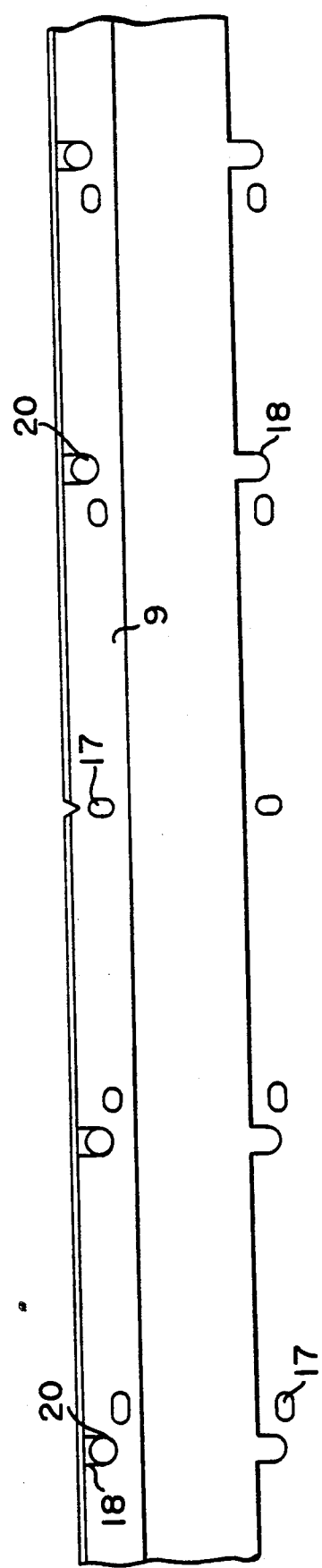
FIG. 3 is a diagrammatic representation of the flexible letterpress form positioned in a rubber-blanket clamping rail in accordance with the invention.

FIG. 3 shows a flexible letterpress form 9 which displays a register system, formed of register holes 17 and register stampings 18, and located in a front or leading region of the plate or form. While the register holes 17, as described hereinbefore, are inserted in-register so as to enclose the register elevations 5 of the register bar 4 of the copying cylinder 1, the register stampings or cut-outs 18 at the front edge of the flexible letterpress form 9 serve the purpose of accurate, in-register positioning on the rubber-blanket cylinder. For this purpose, the register stampings or cut-outs 18 of the flexible letterpress form 9 are inserted so as to surround register elevations 20 of the rubber-blanket clamping rail 19, and clamped fast. The different positions of register holes 17 and register stampings 18 take into account or allow for varying diameters of the copying cylinder 1 and the rubber-blanket cylinder. Assurance is thereby provided that the leading edges of the offset printing forms and of the spot varnishing plate or form are in agreement.

The foregoing is a description corresponding in substance to German application P 39 19 281.4, dated June 13, 1989, the International priority of which is being claimed for the instant application, and which is hereby made part of this application. Any material discrepancies between the foregoing specification and the aforementioned corresponding German application are to be resolved in favor of the latter.

We claim:

1. Method of in-register exposing and printing of a flexible letterpress form for spot varnishing, which comprises fixing on a copying cylinder in-register a flexible letterpress form having a register system in a region of the leading edge of the form, and exposing the form, then clamping the flexible letterpress form on a rubber-blanket cylinder having a greater diameter than that of the copying cylinder so as to compensate for distortion of a subject in circumferential direction during circular exposure.

2. Method according to claim 1, which includes forming the flexible letterpress form with a dimensionally stable substrate.

3. Method according to claim 1, which includes maintaining registry with the register system from mounting of the film to clamping in the varnishing unit, the register system being formed of register holes and register cut-outs.

4. Device for in-register exposing and printing of a flexible letterpress form for spot varnishing comprising, a copying cylinder formed with an axially parallel recess, a register bar with register elevations disposed in said recess in precise register with a register system of a flexible letterpress form, a clamping bar for fixing the flexible letterpress form on said copying cylinder, a rubber-blanket cylinder, a clamping rail likewise having register elevations disposed thereon, said register elevations of said clamping rail engaging in said register system of the flexible letterpress form, said rubber-blanket cylinder having a grater diameter than that of said copying cylinder so as to compensate for distortion of a subject in circumferential direction during circular exposure.

5. Device according to claim 4, wherein side walls of said axially parallel recess are flattened.

6. Device according to claim 4, wherein said clamping bar is comprised of a clamping device, said clamping bar being swingable into said recess of said copying cylinder and being fixable in said recess by means of a snap lock.

7. Device according to claim 4, wherein the flexible letterpress form has mutually overlapping ends in vicinity of said recess, said overlapping ends being fixed on said copying cylinder by means of said clamping bar.

8. Device according to claim 4, including an underlay for the flexible letterpress form, said underlay being disposed on the rubber-blanket cylinder for varying the diameter thereof.

9. Device according to claim 4, wherein said clamping bar is comprised of a clamping device, and including counterweights for said clamping device disposed in the interior of said copying cylinder.

* * * * *